(12) United States Patent
Tung

(10) Patent No.: US 7,023,698 B2
(45) Date of Patent: Apr. 4, 2006

(54) FAN STAND STRUCTURE FOR CENTRAL PROCESSING UNIT

(76) Inventor: Meng Tung, P.O. Box No. 6-57, Junghe, Taipei 235 (TW)

( * ) Notice: Subject to any disclaimer, the term of this patent is extended or adjusted under 35 U.S.C. 154(b) by 215 days.

(21) Appl. No.: 10/729,921

(22) Filed: Dec. 9, 2003

(65) Prior Publication Data

US 2005/0122683 A1 Jun. 9, 2005

(51) Int. Cl.
*H05K 7/20* (2006.01)
*H01L 23/34* (2006.01)

(52) U.S. Cl. ............... 361/697; 361/696; 361/710; 257/707; 257/719

(58) Field of Classification Search ........... 361/687, 361/694–697, 701–704, 709–710, 719, 720; 439/68, 485, 487; 248/510, 511; 24/457, 24/458, 296, 625; 257/705–707, 713, 717–719; 165/80.3, 121, 122

See application file for complete search history.

(56) References Cited

U.S. PATENT DOCUMENTS

| | | | |
|---|---|---|---|
| 6,280,116 B1 * | 8/2001 | Szu | 403/408.1 |
| 6,362,977 B1 * | 3/2002 | Tucker et al. | 361/818 |
| 6,449,154 B1 * | 9/2002 | Yoneyama et al. | 361/704 |
| 6,560,111 B1 * | 5/2003 | Lo | 361/719 |
| 6,560,112 B1 * | 5/2003 | Szu et al. | 361/719 |
| 6,791,847 B1 * | 9/2004 | Ma | 361/816 |
| 2004/0052055 A1 * | 3/2004 | Liu | 361/719 |

* cited by examiner

*Primary Examiner*—Lynn Feild
*Assistant Examiner*—Robert J. Hoffberg

(57) ABSTRACT

A fan stand structure for central processing unit (CPU), in that the stand structure is for locating a heat dissipating fan of a CPU and provides simple installation and replacement processes as well as good stability, includes an upper frame, a lower rear panel, expanding nail assemblies and positioning screw assemblies. The invention is characterized, the lower rear panel is placed at a reverse side and the upper frame is installed at an obverse side of the CPU base of the motherboard, respectively. Using the expanding nail assemblies and the positioning screw assemblies for locating the upper frame and the lower rear panel, a heat dissipating fan is installed at supporting arms of the upper frame, thereby providing a fan stand with simple installation and replacement processes as well as good stability.

2 Claims, 5 Drawing Sheets

FAN STAND STRUCTURE FOR CENTRAL PROCESSING UNIT

BACKGROUND OF THE INVENTION (a) Field of the Invention

The invention relates to a fan stand structure for central processing unit (CPU), and more particularly, to a stand structure for fixing a heat dissipating fan of a CPU, in that the stand structure comprises a lower rear panel and an upper frame.

(b) Description of the Prior Art

With reference to FIG. 1A, a prior central processing unit (CPU) heat dissipating structure a is generally mounted on a CPU base c using a fastening apparatus b, and is located closely to cooling fins a1 and a CPU c1. Heat produced by the CPU c1 is transmitted to the cooling fins a1, and is overblown by the heat dissipating fan a2 situated above. The fastening apparatus c is mostly devised with fastening openings b1 at two ends thereof for fixing with fastening sections c2 at two sides of the CPU base c. This prior structure indeed offers practical conveniences and satisfactory stability. However, thermal energy is relatively increased along with faster and faster CPU speeds, meaning that a volume of the heat dissipating structure is inevitably enlarged in order to provide better heat dissipating effects. It is to be noted that the heat dissipating fan a2 is fastened at the CPU base c, and vibrations of the heat dissipating fan a2 are likely to cause undesired direct effects on the CPU c1. In addition, dimensions of the CPU base c are manufactured according to dimensions of the CPU c1, and are usually in certain specifications. When dimensions of the heat dissipating structure a are larger than those of the CPU base c, fastening the heat dissipating structure a using the fastening apparatus b becomes rather difficult, not to mention that breakage of the fastening sections c2 is easily incurred during replacement to further cause damages of the CPU base c.

To overcome the aforesaid shortcomings, another type of stand d is available for supporting a larger heat dissipating structure a as shown in FIG. 1B. A stand d being a hollow square in shape is disposed at a periphery of the CPU base c, and has supporting frames d1 at two side edges thereof. An upper portion of each supporting frame d1 is provided with fastening openings d11, which work in conjunction with corresponding fastening sections a31 at a plastic housing a3 at the heat dissipating structure 1, so as to mount the entire heat dissipating structure a above the CPU c1 and to facilitate disassembly and assembly of the heat dissipating structure a while also providing enhanced stability. Nevertheless, such fixed stand d is irreplaceable, and therefore it cannot be replaced once the stand d is damaged. It is essential that this prior structure be advanced.

SUMMARY OF THE INVENTION

In the view of the aforesaid shortcomings of the prior inventions, the primary object of the invention is to provide a fan stand structure for CPU, in that the fan stand has simple installation and replacement processes as well as excellent stability.

To accomplish the aforesaid object, a fan stand structure for CPU according to the invention comprises an upper frame, a lower rear panel, expanding nail assemblies and positioning screw assemblies. For corresponding with orifices at a periphery of a CPU base of a motherboard, the lower rear panel has positioning holes at four corners thereof and screw holes at two sides thereof. The lower rear panel is placed at a reverse side of the CPU base of the motherboard, and the upper frame is installed at an obverse side of the CPU base of the motherboard. The upper frame has four supporting arms, and appears as a hollow square shape when viewed from top. For corresponding with the lower rear panel, the upper frame further has positioning holes at four corners thereof and screw holes at two sides thereof.

According to the aforesaid structure, the expanding nail assemblies are inserted through the positioning holes at the four corners of the lower rear panel to become fastened with the upper frame, or the positioning screw assemblies are inserted through the screw holes of the lower rear panel to become fastened with the upper frame. By clamping the motherboard with the upper frame and the lower rear panel, the entire fan stand structure is firmed located at appropriate positions at a periphery of the CPU base, thereby providing simple installation and replacement processes. In addition, points of force application are distributed at the periphery, and therefore vibrations caused by a heat dissipating fan are evenly transmitted to the motherboard to prevent the heat dissipating fan from imposing direct effects on the CPU.

DETAILED DESCRIPTION OF THE PREFERRED EMBODIMENTS

To better understand the structure, devices and characteristics of the invention, detailed descriptions of a preferred embodiment shall be given with the accompanying drawings below.

Figure 1A:
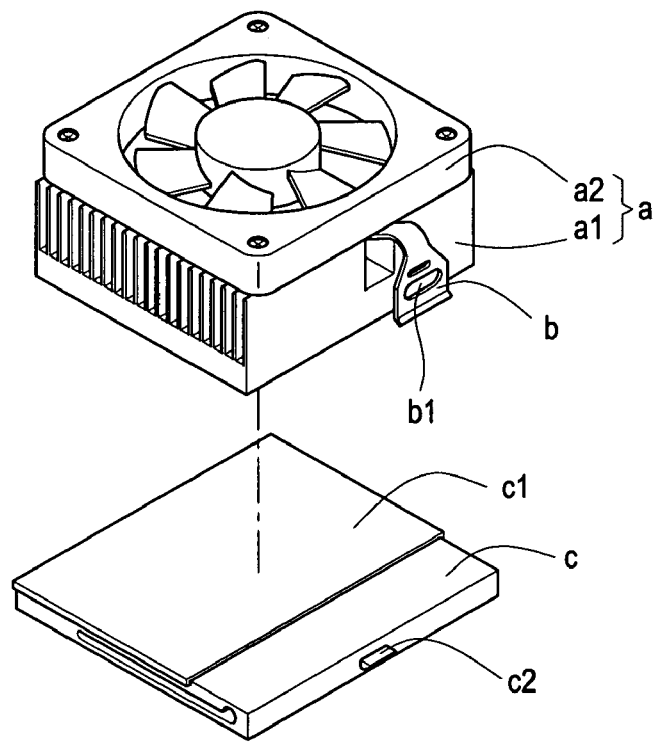
FIG. 1A shows a schematic view of a prior heat dissipating structure using a fastening apparatus.
Figure 1B:
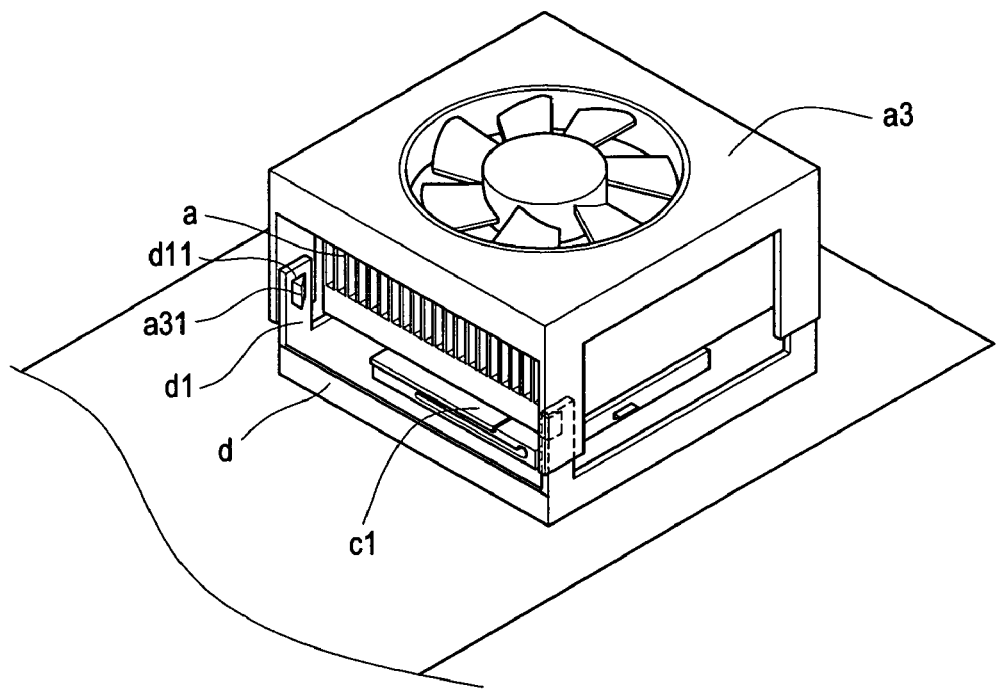
FIG. 1B shows a schematic view of a prior heat dissipating structure using a stand for locating purposes.
Figure 2:
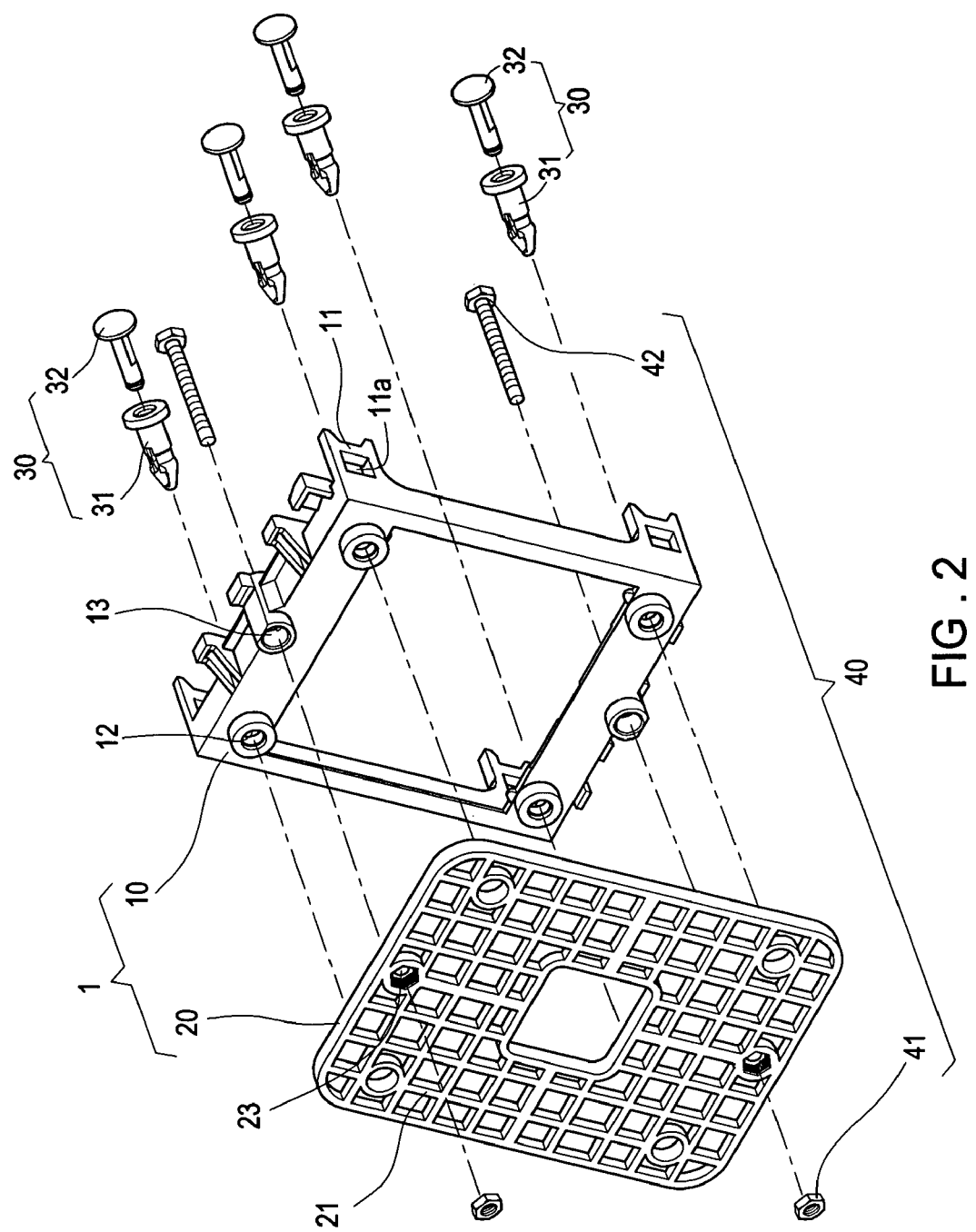
FIG. 2 shows an exploded elevational view illustrating a stand structure according to the invention.

With reference to FIG. 2 showing a fan stand structure for central processing unit (CPU), a stand structure 1 comprises an upper frame 10, a lower rear panel 20, expanding nail assemblies 30 and positioning screw assemblies 40. The stand structure 1 is an integral formed by plastic extrusion.

The upper fame 10 appears as a hollow square when viewed from top, and has four supporting arms 11 at two sides thereof. Each supporting arm 11 has a fastening opening 11a at an upper portion thereof. For corresponding with the lower rear panel 20, the upper frame 10 further has positioning holes 12 at four corners thereof, and screw holes 13 at center portions of two sides thereof.

The lower rear panel 20 is a plate-structure at an obverse side thereof, and has a plurality of reinforcement ribs 21 at a reverse side thereof in order to minimize weight. For corresponding with orifices 2b at a base 2a of a motherboard 2, the lower panel 20 further has four positioning holes 22 at four corners thereof and two screw holes 23 at center portions of two sides thereof.

Each expanding nail assembly 30 is consisted of a main expanding nail 31 and an insertion nail 32. The main expanding nails 31 are first inserted through the positioning holes 12 of the upper frame 10 and the positioning holes 22 of the lower rear panel 20, and then the insertion nails 32 are inserted into the main expanding nails 31, so as to have the main expanding nails 31 expand within the positioning holes 22 of the lower rear panel 20.

Each positioning screw assembly 40 is consisted of a hexagonal nut 41 and a screw 42. The hexagonal nuts 41 are placed in the screw holes 23 of the lower rear panel 20, and the screws 42 are inserted through the screw holes 13 of the upper frame 10 to become screwed and fastened with the hexagonal nuts 41.

Figure 3:
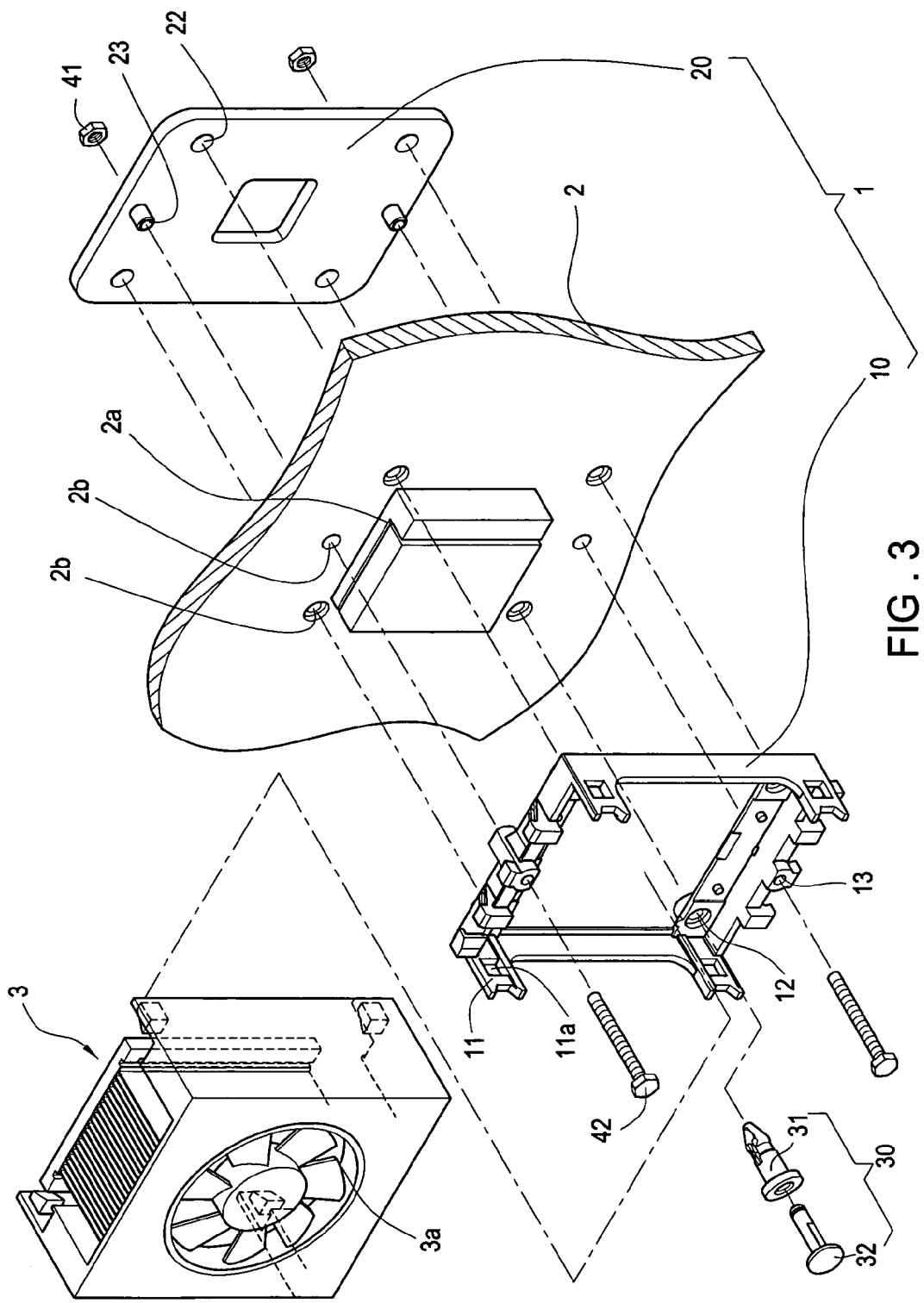
FIG. 3 shows an exploded view illustrating an embodiment according to the invention.
Figure 4:
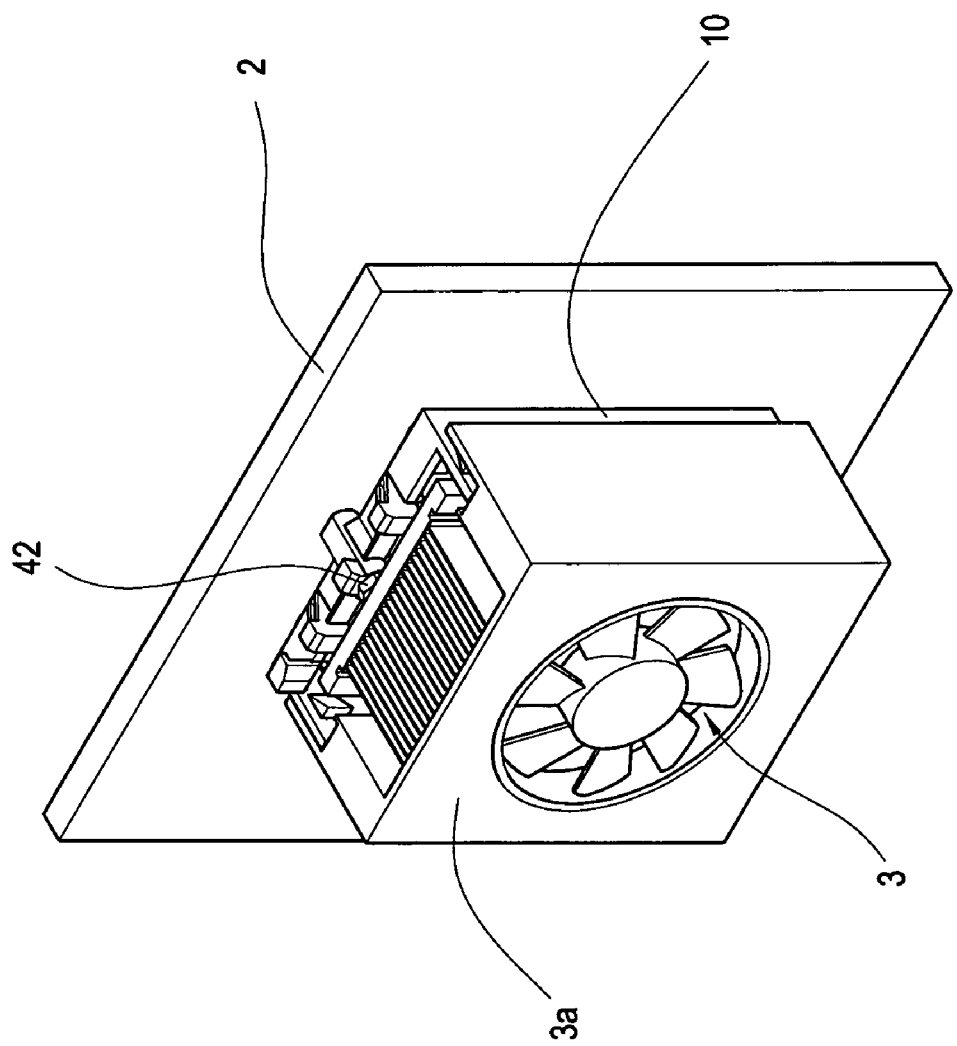
FIG. 4 shows an elevation view illustrating an embodiment according to the invention.
Figure 5:
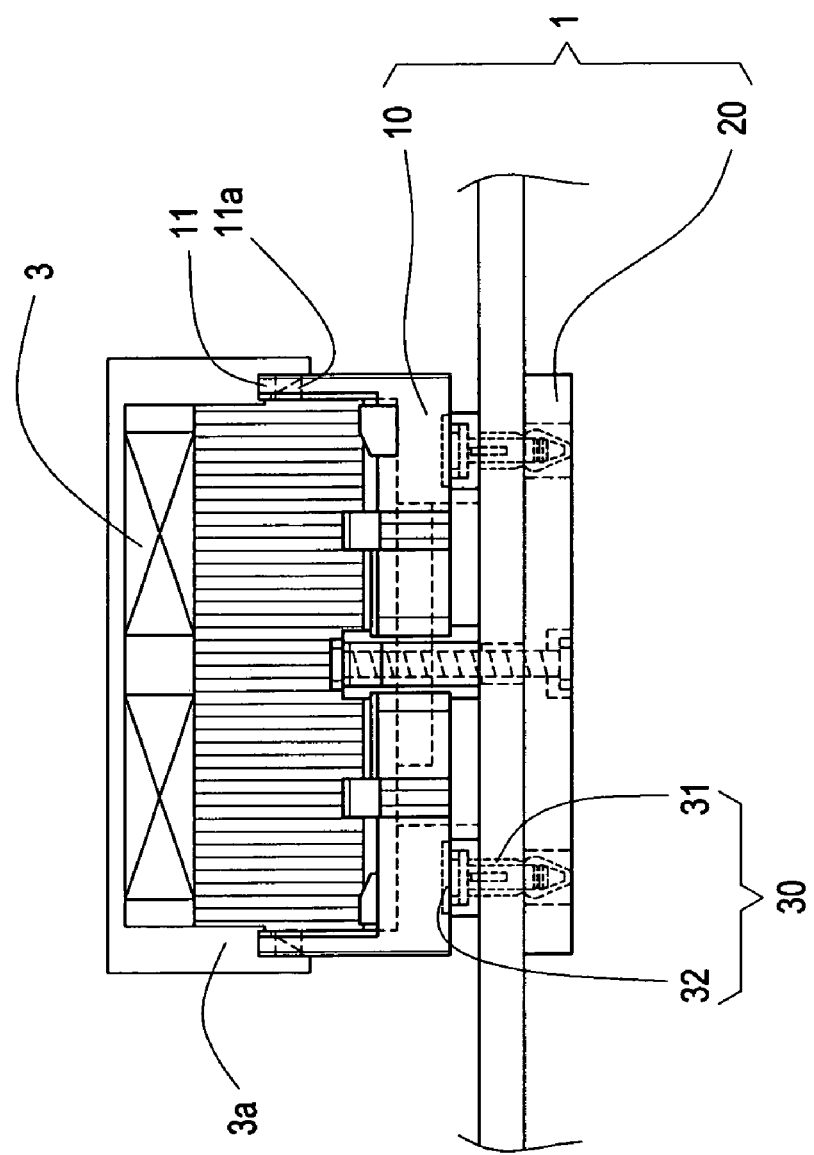
FIG. 5 shows an installation embodiment according to the invention with a heat dissipating structure.

Referring to FIGS. 3 and 4, to mount the stand structure 1 to the motherboard 2, an obverse side of the lower rear panel 20 is leaned against a reverse side of the base 2a, and the positioning holes 22 and the screw holes 23 are aligned with the orifices 2b at the motherboard 2. Next, a reverse side of the upper frame 10 is leaned against an obverse side of the motherboard 2, and the positioning holes 12 and the screw holes 13 are aligned with the orifices 2b at the motherboard 2. The expanding nail assemblies 30 and the positioning screw assemblies 40 are inserted through the positioning holes 12 and 22, and the screw openings 13 and 23, thereby clamping the motherboard 2 at a center portion of the stand structure 1. Referring to FIG. 5 showing an installation embodiment according to the invention with a heat dissipating structure 3, the heat dissipating structure 3 is fastened with the fastening openings 11a at the supporting arms 11 of the upper frame 10 using a plastic frame 3a.

Conclusive from the above, the fan stand structure for CPU according to the invention utilizes the upper frame and the lower rear panel to clamp and position the motherboard. The invention not only locates the fan stand for simply installation and replacement purposes, but also provides overall stability. It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A fan stand structure for central processing unit (CPU), in that the stand structure is for locating a heat dissipating fan of a CPU and provides simple installation and replacement processes as well as good stability, comprising an upper frame, a lower rear panel, expanding nail assemblies and positioning screw assemblies; wherein:

the upper frame appears as a hollow square shape when view from top; and has four supporting arms at two sides thereof, and locating holes at four corners thereof and screw holes at center portions at two sides thereof for corresponding with the lower rear panel;

the lower rear panel appears as a plate-structure at an obverse side thereof, and is provided with a plurality of reinforcement ribs at a reverse side thereof for minimizing weight; and has four positioning holes at four corners thereof and two screw holes at center portions of two sides thereof for corresponding with orifices at a periphery of a CPU base of a motherboard;

each of four expanding nail assemblies is consisted of a main expanding nail and an insertion nail; wherein, the main expanding nails are inserted through the positioning holes of the upper frame and the positioning holes of the lower rear panel, and the insertion nails are inserted into the main expanding nails to have the main expanding nails expand within the positioning holes of the lower rear panel, thereby enabling the expanding nail assemblies to fasten or loosen with elastic adjustment;

each of two positioning screw assemblies is consisted of a hexagonal nut and a screw; wherein, the hexagonal nuts are placed in the screw holes of the lower rear panel, and the screws are inserted through the screw holes of the upper frame to become screwed and fastened with the hexagonal nuts; and using the aforesaid structure, a reverse side of the upper frame is leaned against an obverse side of the motherboard, an obverse side of the lower rear panel is leaned against a reverse side of the motherboard, the positioning holes and screw holes are aligned with orifices at the motherboard, and the motherboard is clamped and located at a center portion of the stand structure using the expanding nail assemblies and the screw assemblies.

2. The fan stand structure for CPU in accordance with claim 1, wherein each supporting arm of the upper frame has a fastening opening.

* * * * *